United States Patent [19]

Leamy

[11] Patent Number: 4,670,086

[45] Date of Patent: Jun. 2, 1987

[54] PROCESS FOR THE GROWTH OF STRUCTURES BASED ON GROUP IV SEMICONDUCTOR MATERIALS

[75] Inventor: Harry J. Leamy, Summit, N.J.

[73] Assignees: American Telephone and Telegraph Company; AT&T Bell Laboratories, both of Murray Hill, N.J.

[21] Appl. No.: 744,889

[22] Filed: Jun. 14, 1985

Related U.S. Application Data

[63] Continuation of Ser. No. 414,850, Sep. 3, 1982, abandoned, which is a continuation of Ser. No. 231,238, Feb. 4, 1981, abandoned.

[51] Int. Cl.⁴ ............................................. C30B 1/08
[52] U.S. Cl. ........................... 156/620; 156/DIG. 64; 156/DIG. 67; 156/DIG. 80; 156/DIG. 88; 156/DIG. 102
[58] Field of Search ............... 156/603, 604, 606, 610, 156/612–614, 620, DIG. 64, DIG. 67, DIG. 80, DIG. 88, DIG. 102; 423/348, 349; 148/15, 175; 427/86, 95

[56] References Cited

U.S. PATENT DOCUMENTS

| | | | |
|---|---|---|---|
| 3,389,022 | 6/1968 | Kravitz | 156/603 |
| 3,413,157 | 11/1968 | Kuiper | 156/603 |
| 3,549,432 | 12/1970 | Sivertsen | 156/DIG. 80 |
| 3,928,092 | 12/1975 | Ballamy et al. | 156/612 |
| 4,046,618 | 2/1975 | Chaudhari et al. | 156/DIG. 88 |
| 4,066,482 | 1/1978 | Shaw | 156/612 |
| 4,308,078 | 12/1981 | Cook | 156/604 |
| 4,323,417 | 4/1982 | Lam | 156/DIG. 88 |
| 4,330,363 | 5/1982 | Biegesen et al. | 156/603 |

OTHER PUBLICATIONS

Tamura et al, Si Bridging Epitaxy from Si Windows onto SiO₂ by Q-Switched Ruby Laser Pulse Annealing, Japanese Journal of Applied Physics, vol. 19, No. 1, Jan. 1980, pp. 23–26.

*Primary Examiner*—David L. Lacey
*Attorney, Agent, or Firm*—Bruce S. Schneider

[57] ABSTRACT

Single crystal layers of Group IV semiconductor materials, such as silicon, are grown on insulating substrates. The fabrication of this structure is achieved by forming on a single crystal substrate a layer of an insulating material, such as a silicon oxide. A small via hole is produced in the insulating layer to leave a portion of the underlying substrate uncovered. A precursor material is deposited on the insulating layer so that it covers at least a portion of the insulating layer and also contacts the substrate at the via hole. The precursor layer is then formed into a single crystal by inducing growth on the substrate at the via hole and propagating this growth through the precursor layer.

13 Claims, 25 Drawing Figures

U.S. Patent   Jun. 2, 1987   Sheet 1 of 3   4,670,086
FIG. 1
FIG. 1A
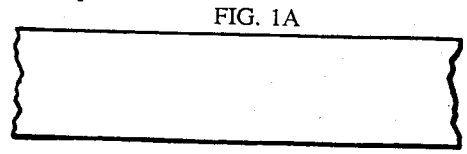
FIG. 1B
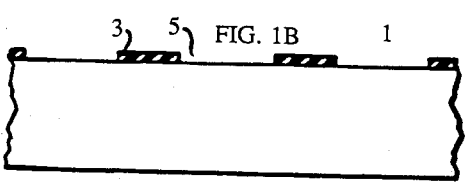
FIG. 1C
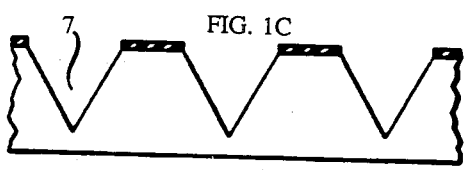
FIG. 1D
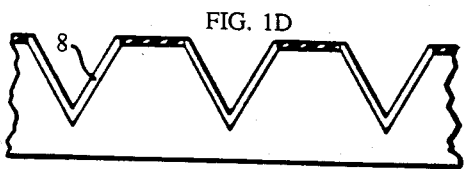
FIG. 1E
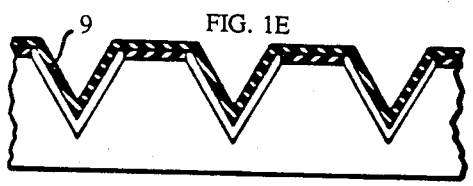
FIG. 1F
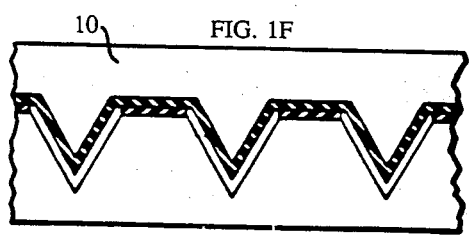
FIG. 1G
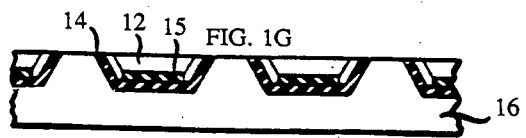
FIG. 2
FIG. 2A
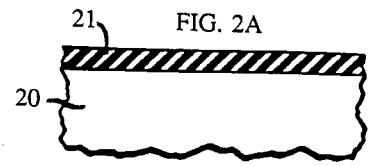
FIG. 2B
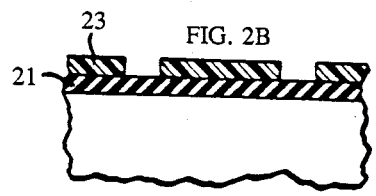
FIG. 2C
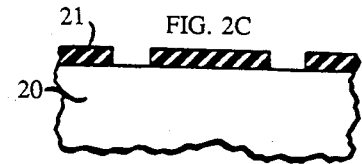
FIG. 2D
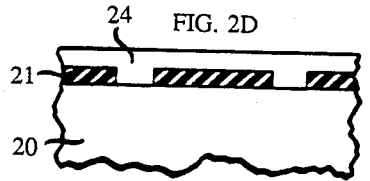

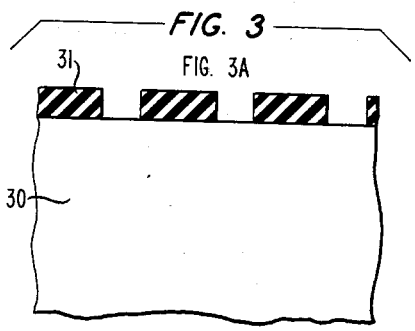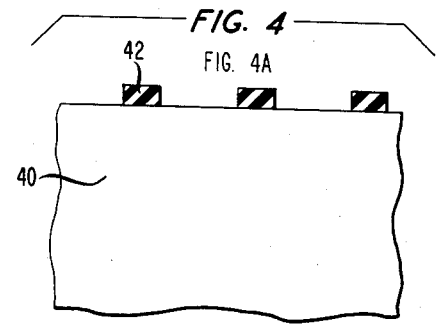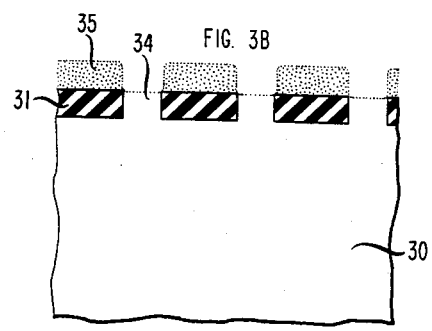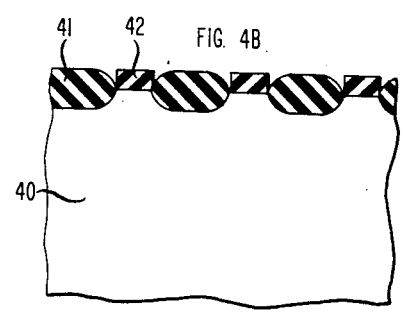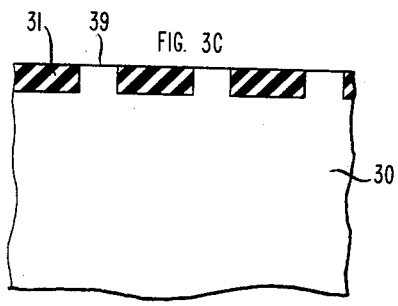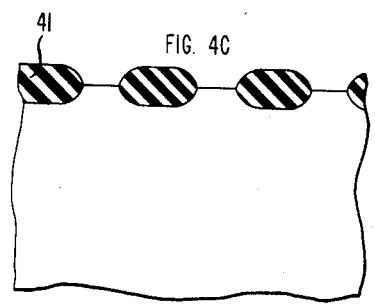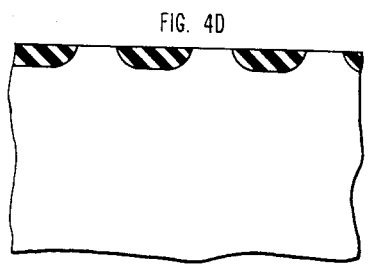

FIG. 5
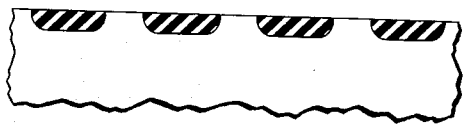
FIG. 5A
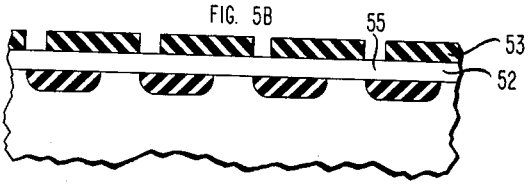
FIG. 5B
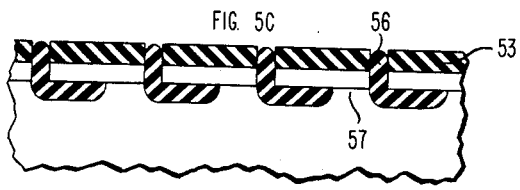
FIG. 5C
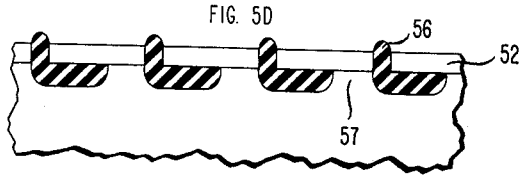
FIG. 5D
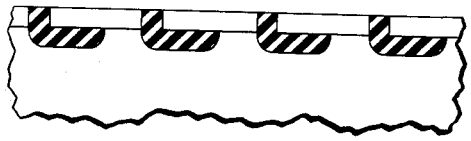
FIG. 5E
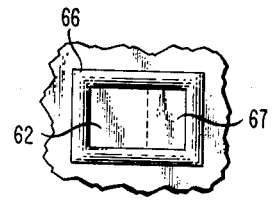
FIG. 6
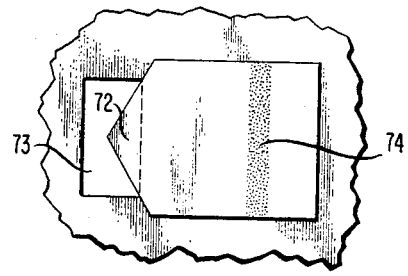
FIG. 7

PROCESS FOR THE GROWTH OF STRUCTURES BASED ON GROUP IV SEMICONDUCTOR MATERIALS

This application is a continuation of application Ser. No. 414,850, filed Sept. 3, 1982, now abandoned, which was a continuation of application Ser. No. 231,238, filed Feb. 4, 1981, now abandoned.

BACKGROUND OF THE INVENTION

1. Field of the Invention

This invention relates to semiconductor devices and, more particularly, to semiconductor devices based on Group IV elements.

2. Art Background

The desirability of fabricating devices based on Group IV elements, such as silicon, by building the device within an electrically insulated semiconductor region has long been realized. Such an insulated device has many advantages over a conventional device that is formed directly on a silicon substrate. In a conventional device radiation such as alpha particles produces carriers in a conducting substrate and these carriers introduce spurious signals in the active region of the semiconductor device. In contrast, for an insulated device such radiation produces carriers in a silicon substrate but these carriers cannot migrate through the insulating layer. Thus, spurious signals in the active region are not produced. Further devices built on insulators offer the possibility of lower capacitance and thus faster switching times than conventional devices. Finally, since the active semiconductor regions of insulated devices are electrically isolated, these separate regions are maintainable at different potentials without undesirable interactions.

To obtain the advantages of insulated devices utilizing Group IV semiconductor materials, numerous technologies have been developed. However, all of these approaches involve elaborate procedures that do not easily lend themselves to other than laboratory production techniques. For example, a large experimental effort has been devoted to forming silicon devices on sapphire substrates. The production of a high quality silicon epitaxial layer on a sapphire substrate is extremely difficult and costly. Thus, devices to meet exacting specification are not produced by the silicon on sapphire technique.

Similarly, techniques have been developed for producing single crystals of silicon on insulators such as silicon oxides. Representative of these techniques are the dielectric isolation processes. (These processes are described by K. E. Bean and W. R. Runyon, *Journal of the Electrochemical Society*, 124, No. 1, p. 5C, (1977).) Dielectric isolation entails a multistep, elabrate procedure that is shown in FIG. 1. Initially, a substrate of high quality silicon is prepared. This silicon substrate, 1 in FIG. 1, is coated with an insulating material such as silicon oxide, 3, and holes, 5, are formed in the oxide by conventional techniques, e.g., photolithography followed by anisotropic chemical etching. Grooves, 7, are then etched in the exposed portions of the silicon underlying the holes in the dielectric material. These grooves, 7, are epitaxially coated with a layer of N+ silicon, 8. The N+ silicon is, in turn, coated with an insulator, 9, such as silicon oxide. The insulator is once again, in turn, coated with a layer of polysilicon, 10. The structure produced is shown in FIG. 1F. The entire structure is then inverted and the silicon substrate 1, is ground off until the structure shown at 1G is obtained. In this structure, the remaining high quality silicon is denoted by 12, insulating layers are indicated by 14 and 15, and polysilicon is indicated by 16. Thus, the final structure has single crystal silicon, 12, on an electrically insulating material. In this manner, the active region of the silicon device is electrically insulated with the resulting reduction of spurious signals and switching time.

As can be appreciated from the description and from FIG. 1, dielectric isolation involves a multitude of complicated processing steps. Thus, this technique has only been used for applications which require production of devices where properties are critical and where expense is a secondary factor. Although the production of devices within an electrically insulated Group IV semiconductor region has been shown to have great advantages, the production of such devices by a process that is easily adaptable to other than laboratory procedures has been difficult.

SUMMARY OF THE INVENTION

Devices of Group IV semiconductor materials built on electrically insulated bodies are producible. These bodies are preferably fabricated by first employing a substrate of a high quality crystalline material, e.g., silicon, upon which the desired Group IV semiconductor material will undergo epitaxial growth. An electrically insulating composition, such as silicon nitride or a silicon oxide, is formed on the substrate. A via hole is produced by conventional techniques in the insulating material so that a portion of the underlying substrate is exposed. A precursor material is then formed on the resulting structure so that it contacts the exposed portion of the substrate through the via hole and extends to and covers at least a portion of the insulating material. Crystal growth is induced at the precursor/substrate interface at the via hole by techniques such as laser melting of the precursor material at the via hole. This growth is then propagated through the precursor by conventional techniques such as those employed in zone refining.

The silicon crystal formed from the precursor is electrically insulated from the underlying substrate by removing the via hole and the crystalline material occupying the via hole through techniques such as etching followed by passivation by techniques such as thermal oxidation. This procedure produces the desired silicon isolated structure.

Useful structures are also formed by maintaining the connection between the substrate and the material produced from the precursor. It is then possible to build devices both in the substrate and in the material produced from the precursor material. The via hole and the material occupying this hole acts as an electrical and thermal contact between the two device layers.

BRIEF DESCRIPTION OF THE DRAWING

FIGS. 1A through 1G are illustrative of techniques used to produce Group IV materials that are electrically isolated; and FIGS. 2A through 2D, 3A through 3C, 4A through 4D, 5A through 5E, 6, and 7 are illustrative of the subject invention.

DETAILED DESCRIPTION

The formation of single crystal Group IV semiconductor materials overlying an insulating substrate relies on the induced growth of a crystal from a precursor material at a via hole. As discussed, the via hole allows contact between the precursor material and a single crystal Group IV semiconductor substrate that is uncovered at the via hole. For pedagogic purposes, the formation of an insulating layer on a suitable substrate together with the formation of the via hole will be discussed first. Then, a description of the formation of a single crystal material overlying the insulator formed from the precursor material will be discussed.

1. SUBSTRATE, INSULATOR, AND VIA HOLE FORMATION

Most preferably, a single crystal of Group IV semiconductor material, such as a single crystal of silicon or germanium, is utilized as the substrate. (The composition of the substrate is not essential provided it induces nucleation of a Group IV semiconductor material. Because of the ready availability, it is most convenient to use a Group IV semiconductor material itself.) The major face of the substrate should correspond to the crystallographic orientation desired for the semiconductor material that will ultimately overlie the insulating layer. For example, if it is desired to form a silicon single crystal with a (100) crystallographic orientation on an insulating material, a silicon substrate with a major plane coextensive with a (100) crystallographic plane is employed. The formation of this substrate with the appropriate crystallographic plane as the major face is accomplished by conventional techniques. In a preferred embodiment, a boule is grown by techniques such as the Czochralski method, the boule is oriented along the desired plane, and sawn to yield the desired crystallographic plane. (See S. H. Matlock in *Semiconductor Silicon*-1977, The Electrochemical Society, Princeton, H. R. Huff and E. Sirtl, Editors, pp. 32–52, for an extensive discussion of the conventional techniques employed for forming wafers of materials such as silicon.) Obviously, if the particular plane employed is not important for a given application, the orientation of the substrate is also not important, provided the region of the substrate exposed at the via hole is a single crystal. Additionally, except where single crystal material is to be formed through a precursor region emanating from more than one via hole, only the uncovered portion of the substrate at the via hole and not the whole substrate need be a single crystal. However, it is generally more convenient to use a substrate that is essentially a single crystal.

An insulating layer is formed on the major face of the substrate. The composition of the insulating layer is not critical. However, different insulating layers have different thermal conductivities and, thus, affect the growth process. In situations where during processing the substrate is significantly cooler than the precursor, the use of an insulator with low thermal conductivity, conductivity less than 0.1 W/cm-degree K, generally requires additional power to melt the precursor at the via hole. This phenomenon occurs because the insulator prevents heat transfer to the substrate; the substrate stays significantly cooler than the precursor; and, thus, heat is rapidly removed at the via hole where the precursor directly contacts the substrate. If a significant amount of additional power is not supplied, the precursor at the center of the via hole does not melt. The polycrystalline via hole center then prevents propagation of any single crystal growth occurring at the via hole periphery. If limited power is available, for example, if a relatively low power laser is utilized, expedients, as discussed later, are available for overcoming such problems and still employing insulators with lower thermal conductivities. Obviously, if the method utilized for forming the precursor into the single crystal is not limited in the amount of available power or the substrate is not kept significantly cooler than the precursor, insulators with lower conductivity are employable, provided the heat generated is not great enough to substantially melt the substrate.

The necessary electrical properties of the chosen insulating material depend on the ultimate use of the device. For example, if the device is to be used in an application requiring the isolation of high voltages, the material should generally have a dielectric strength of at least $10^6$ V/cm. Alternatively, if the structure is used in low current and voltage applications, such as digital signal processing, dielectric strengths greater than $10^4$ V/cm generally are adequate. (These dielectric strengths assume the use of an insulating layer with a thickness in the range of about 1000 to 10,000 Angstroms. Significantly different thicknesses require an appropriate adjustment in dielectric strength.) Finally, the insulating layer should not be of a composition that causes nucleation in the precursor material. If this condition is not satisfied, the propagation of the crystal growth induced at the via hole to form a single crystal is made difficult. Generally, this criterion is easily satisfied for amorphous insulators. However, polycrystalline insulators typically are disadvantageous. Further, in devices used for low signal applications such as logic circuitry, the number of electronic states produced at an interface between the insulator and a region of a Group IV material that is to be used as a device active region should usually be limited to less than $10^{12}/cm^{+2}$. For example, combinations of Group IV and insulating materials such as Si and amorphous, silicon oxides are suitable for such demanding applications.

Once the desired insulator is chosen, it is formed on the substrate by conventional techniques. For example, if a silicon substrate is utilized, it is possible to heat the upper surface of the substrate in an oxygen ambient, thus forming a silicon dioxide film on the substrate. Similarly, if a silicon nitride insulating material is desired, techniques such as plasma deposition are employed to deposit the desired film. (See M. J. Rand, *Journal of Vacuum Science & Technology*, 16, 420 (1979) for a description of the plasma deposition of silicon nitride.) Other techniques, such as chemical vapor deposition, are also available for formation of the desired insulator.

The thickness of the insulating region again depends on the ultimate application. The insulating material should not be so thin that the desired resistance and break down voltage necessary to isolate the substrate from the overlying crystal material is not achieved. Generally, for most low current applications, leakage currents between the substrate and a device active region should be less than $10^{-6}$ amps. To satisfy this criterion insulating layers having resistivities greater than $10^6$ ohm-cm, and break down voltages greater than 10 V typically are necessary. For typical insulating layers, thicknesses in the range 100 Angstroms to 10 $\mu$m, preferably in the range 1000 Angstroms to 1 $\mu$m, are generally employed to yield the desired resistance.

The insulating material is formed so that the surface of the substrate-insulator composite structure includes regions of both insulator and substrate, i.e., via holes are formed. (It is possible to produce a number of via holes through the insulating layer.) The size of the via hole is not critical. However, holes having a large cross-sectional area limit the amount of insulator area and, therefore, limit the amount of area of single crystal Group IV semiconductor material that is isolated from the underlying substrate. Therefore, for economic reasons, it is typically desirable to limit via hole formation to cross-sectional areas in the range from 1 to 10 times the dielectric layer thickness. Holes having a very small cross-sectional area, i.e., less than 1 $\mu$m, are desirable since less useful area is occupied and since thermal problems are reduced. However, present lithographic techniques in many applications limit the size of via holes generally to larger than 1 $\mu$m.

The via holes are formed by lithographic techniques. First it should be noted that the term via hole corresponds both to the structures such as those shown in FIGS. 3C, 4D, and 5E, as well as to that of FIG. 2C. In FIG. 2, a hole is made in the insulator, 21, to expose the substrate, 20. In FIG. 3, the substrate, 30, extends through the insulating material, 31, and is exposed at the via holes, 39. (In fact, it is possible that the substrate extends at the via hole above the insulator.) Numerous methods are available for forming such via holes. For example, as shown in FIG. 2, a resist material, 23, is deposited on the insulating layer, 21. A pattern is then delineated in this resist material so that the portions of the insulating material where the via holes are to be formed are uncovered. (The resulting structure is shown at 2B.) The uncovered portions of the insulating material are then etched by techniques such as reactive ion etching. (See *Thin Film Processes*, Ed. J. L. Vossen and W. Kern, Academic Press, N.Y. (1978), Chapter V, pp. 401–557, for a description of the etching of a variety of insulating materials.) The etching is continued until the underlying substrate in the delineated pattern is uncovered, resulting in the structure of 2C. (The precursor, 24, as described below is then introduced to yield the structure of 2D.) Some etching of this substrate is possible and generally does not degrade the results achieved. However, techniques, such as ion beam sputter etching that might destroy the crystallographic orientation of the substrate at the substrate/insulating material interface, is not desirable.

Other approaches for producing via holes are shown in FIGS. 3, 4, and 5. As shown in FIG. 3, it is possible to form the via holes by beginning with the structure shown at 2C in FIG. 2 and at 3A in FIG. 3. A layer of material, the same as that used for the formation of the substrate, is then deposited by conventional techniques such as chemical vapor deposition onto the structure. Upon deposition, an epitaxial layer, 34, forms on the substrate and polycrystalline material, 35, forms on the insulating material. The polycrystalline material is then selectively etched by conventional chemical methods leaving the structure shown at 3C with the substrate extending through the insulating layer.

Alternatively, as shown in FIG. 4, a patterned layer of a protective material such as $Si_3N_4$ is deposited by conventional techniques such as chemical vapor deposition, such that the protective material, 42, covers the area of the substrate, 40, where the via holes are ultimately to be positioned. The exposed portions of the substrate are oxidized to form an insulator, 41. For example, in the case of a silicon substrate, thermal oxidation is performed. The protective layer, 42, is then removed. This yields the structure shown at 4C where insulator 41 corresponds to the thermally formed silicon oxide. The via holes thus formed may be utilized as such, or if a planar surface such as obtained in the procedure described in FIG. 3 is desired, the portion of the silicon oxide layer extending above the substrate is removed by partial etching to leave the planar structure at 4D.

The surface obtained as shown at 4D is useful by itself or further processing is possible. As illustrated in FIG. 5, the structure obtained at 4D and reproduced at 5A is further processed by forming the precursor layer, 52, to be transformed into a single crystal region. A protective layer, 53, such as a silicon nitride layer, is then deposited and patterned so that the protective layer is formed wherever a region of electrically isolated Group IV semiconductor is desired. The areas, 55, of the polycrystalline precursor are oxidized through the precursor to form insulating regions, 56. The structure thus obtained, as shown at 5C, has via holes denoted by 57. This structure is used as such or the protective layer, 53, is optionally removed. A plan view of the resulting via configuration is shown in FIG. 6 where 66 corresponds to area 56 in 5D, the imaginary dotted line outlines the via hole, 67, below precursor, 62, corresponding to hole, 57, and precursor, 52, respectively. The advantage of this embodiment is that the projecting insulator, 66, forms a dielectric trough for a liquid portion of the precursor, thus, eliminating the need for other means of confining liquid compositions. However, it is possible to etch the exposed portions of the insulator to obtain a planar structure such as shown at 5E.

2. FORMATION OF THE PRECURSOR AND TRANSFORMATION OF THE PRECURSOR INTO A SINGLE CRYSTAL MATERIAL

It is possible to employ a precursor material that is either in the solid or liquid phase. For example, a polycrystalline material is deposited onto the insulating layer. This polycrystalline material acts as the precursor for the desired single crystal layer. Alternatively, a liquid such as a liquid alloy of the desired semiconductor material and a composition that liquefies at temperatures below the melting point of both the semiconductor substrate and the dielectric layer is employed. The alloy is kept on the insulator at temperatures which maintain the liquid phase structure of the precursor until it is desired to initiate transformation of this layer into the desired single crystal material.

Irrespective of the phase of the precursor material, transformation from a precursor to a single crystal layer that overlies at least a portion of the insulating film is accomplished by inducing crystal growth at the precursor/substrate interface found at the via hole. This initial crystal growth is propagated through all or a desired portion of the precursor material. (If a plurality of via holes is employed, it is possible to use a precursor that contacts the substrate only at a particular hole, one that extends to a plurality of holes, or one that extends to all the holes. In the latter two cases, even if growth is induced at a plurality of holes, propagation of each growth does not interfere with that of another and the propagation front of each initial growth appropriately joins to continue the propagation, provided that the substrate is essentially a single crystal.)

Induction of crystal growth at the via hole is accomplished by establishing an appropriate chemical potential gradient in the precursor. The gradient is typically produced by employing a thermal gradient or by using a composition gradient. In the case of a liquid alloy precursor, the temperature of the environment is lowered until the liquid precursor is saturated with semiconductor atoms. As the temperature continues to decrease, precipitation of the semiconductor atoms occurs preferentially on the exposed substrate crystal at the via hole where the formation of an isolated crystal is not required. This changes the composition of the remaining precursor liquid, and as the temperature continues to drop, crystal formation again is preferentially induced at the extension of the substrate crystal that has been forming. This process continues so that a single crystal propagates from the via hole continuously through the precursor. Thus, no isolated crystallites are formed to degrade the properties of the resulting Group IV semiconductor. In this manner, through a compositional gradient, propagation is achieved.

Exemplary of a liquid precursor is the use of an alloy of 30 atom percent silicon and 70 atom percent aluminum formed and liquefied on an insulating layer that overlies a single crystal substrate of silicon. The liquid state of this precursor is maintained at a temperature of approximately 850 degrees C. until crystallization is desired. This crystallization is initiated by lowering the temperature to approximately 840 degrees C. The crystal growth is propagated by continuing to lower the temperature. Typically, the temperature is lowered at a rate in the range from 10 degrees per hour to 10 degrees per second. Slower rates generally are impractical and faster rates generally induce dendritic crystal growth. The result is a single crystal material that is formed on the desired insulator.

If a solid precursor is employed, nucleation and propagation are preferably induced through zone refining techniques. (See U.S. Pat. No. 2,739,088, issued Mar. 20, 1956, which is hereby incorporated by reference, for an exhaustive discussion of zone refining.) The first zone is established over the via hole and is formed to extend to the boundaries of the precursor layer, e.g., a zone, 72 in FIG. 7, is formed over via hole, 73. This zone is established by techniques such as laser melting.

As discussed previously, the heating technique such as the use of a laser might have insufficient power itself to form the initial zone. Additionally, it is possible that a lateral temperature gradient associated with a localized liquid zone will promote gross distortion of the liquid zone. These difficulties are overcome by heating the substrate to a temperature near, but below its melting point so that the energy from the laser necessary to form the desired zone and the thermal gradients at the zone edge are substantially reduced. Alternatively, it is possible to avoid liquid zone distortion by utilizing a fully encapsulated precursor such as shown at 5C. Following crystal growth, the protective cap, 53, is removed by conventional techniques such as chemical etching. Other heat sources that generally do not have energy limitations such as strip heaters, arc image furnaces, or electron beams also are employable. Obviously, irrespective of heat source, extensive melting of the substrate should be avoided by maintenance of a thermal gradient perpendicular to the major surface of the substrate, e.g., by putting the substrate on a heat sink.

The initial zone, 72, is propagated throughout the precursor material. This propagation as indicated by zone, 74, (shown in stippling) is done by translating the energy source or by translating the substrate relative to the energy source. This translation should preferably occur through the entire precursor layer. If propagation through the precursor is incomplete, the remaining precursor material may nucleate undesirable polycrystalline formation at the extremities of the final zone position. However, if the material in this area is expendable, termination before propagation throughout the entire precursor material is possible and is not precluded.

As noted in the zone refining embodiment, a thermal gradient is employed to form and propagate the initial growth at the precursor/substrate interface through the precursor material. As discussed, the energy applied during formation or propagation should not induce the melting of the underlying insulating material or substrate. Rather than employing an appropriate precaution, in some situations it is more convenient to use an alloy that melts at a temperature lower than that of the pure semiconductor material. For example, if a polycrystalline silicon precursor is utilized with a silicon substrate, the energy necessary to melt the solid precursor is advantageously lowered by alloying it with a material such as aluminum, tin, lead, germanium, gold, or a mixture of these materials. The alloy is initially prepared and then deposited on the insulator, or a polycrystalline silicon precursor is deposited on the insulator and an overlying layer composed of the desired alloy constituent is deposited on the polycrystalline silicon. Upon establishing the initial zone, the overlayer alloys with the silicon and the desired result is achieved.

The following examples illustrate the process parameters and materials typically utilized in the subject invention:

EXAMPLE 1

A single crystal, polished silicon wafer with major surface corresponding to a (100) plane, measuring 3 inches in diameter, was employed. The wafer was cleaned by sequentially immersing it in trichloroethane, acetone, and methanol. The wafer was immersed for 10 seconds in a 10-to-1 solution of HF in water. A 1 $\mu$m thick oxide layer was formed on the major surface of the substrate by thermal oxidation in steam at 1000 degrees C. The wafer was placed into a quartz tube furnace and the furnace was heated to approximately 1000 degrees C. Oxygen at a rate of 5 cc per minute was bubbled through a water bubbler. The output from this bubbler was then introduced into the quartz furnace. The treatment of the wafer was continued for 6 hours.

A layer of photoresist was then spun onto the oxide coating. The resist was exposed to appropriate actinic radiation and developed to yield a square array of 15 $\mu$m by 15 $\mu$m holes that were placed 100 $\mu$m on centers. The portions of the underlying silicon dioxide layer showing through the holes in the photoresist were then removed by chemical etching with a 10-to-1 aqueous HF solution. After the chemical etching, the photoresist was removed with acetone.

A layer of polysilicon was then deposited onto the structure with its via holes. This layer was formed in a chemical vapor deposition process by heating the substrate to 625 degrees C. and passing silane over the substrate. The silane was introduced to yield a pressure of 1 atm. This treatment was continued until a thickness of 0.48 $\mu$m was grown. The procedure was then discontinued and the substrate was allowed to cool to room temperature.

The deposited polysilicon layer was cleaned by immersing it for 10 seconds in a 10-to-1 HF in water solution. The wafer was then placed on the sample holder of an electron beam evaporation apparatus with the polysilicon face exposed. An aluminum target was impacted with electrons that were accelerated with a potential of 20 keV. The deposition was continued until an aluminum thickness of approximately 1.6 μm was attained. (This thickness corresponded to an aluminum to polysilicon atomic ratio of approxiamtely 25 atom percent.)

The wafer was inserted into a quartz tube furnace that had been heated to 800 degrees C. The furnace was kept at this temperature for approximately 5 minutes and then the temperature reduced at a rate of approximately 20 degrees C. per minute until room temperature was reached. The resulting structure was observed to have a single crystal formed and extending from each via hole. The crystal extended approximately 25 μm beyond the edge of the hole. (The crystal size in this example was limited by the amount of aluminum used in conjunction with the polysilicon. Since a large percentage of aluminum was utilized, the eutectic point of the mixture was reached after the growth of approximately 25 μm of crystal beyond the via hole. If larger crystals are desired, less aluminum is utilized.). The solidified aluminum alloy overlying the single crystals was removed by chemical etching.

EXAMPLE 2

The same procedure was followed as described in Example 1 except after the aluminum layer was deposited, the resulting structure was processed by scanned laser irradiation. This laser scanning was accomplished by first supporting the sample on a substrate heated to 300 degrees C. The beam of a 50 W carbon dioxide laser was focussed to form a molten zone of approximately 500 μm in diameter over several via holes. (The beam wavelength was approximately 10.6 μm.) The beam was scanned across the aluminum layer at a rate of 1 cm per second. The material formed inside this track was single crystal silicon with the crystal linking several via holes.

EXAMPLE 3

A wafer as described in Example 1 was polished and thermally oxidized as described in Example 1 to yield a silicon dioxide layer thickness of 200 Angstroms.

Amorphous silicon nitride was then deposited on this silicon dioxide layer. This deposition was accomplished by chemical vapor deposition. The wafer was inserted on the substrate of a chemical vapor deposition apparatus. The apparatus was heated to 800 degrees C. and a gas composition of silane and ammonia at a ratio of 300-to-1 was introduced at a pressure of 1 atm. The treatment was continued until a thickness of 1000 Angstroms was obtained. The procedure was then terminated and the wafer cooled.

By the lithographic process described in Example 1, an array of 5 by 5 μm square holes on 100 μm centers over the entire wafer was produced. The etching through the silicon nitride and the silicon oxide layer to uncover the silicon substrate was performed in a plasma etching apparatus utilizing a $CF_4$ atmosphere. A 1000 Angstrom thick layer of polysilicon was then deposited onto the structure as described in Example 1. The polysilicon deposition resulted in the formation of polysilicon itself on the silicon nitride, but growth of an epitaxially silicon region in the via holes. The polycrystalline silicon overlying the silicon nitride was removed by a chemical etchant described by F. Secco D'Aragona in *Journal of the Electrochemical Society*, 119, 948 (1972). The wafer was inserted on the sample holder of an electron beam evaporation apparatus. A silicon target was bombarded with electrons accelerated by a voltage of 20 keV. The evaporation was continued until a ½ μm layer thickness of silicon was deposited.

The structure thus produced was mounted on a sample holder heated to approximately 310 degrees C. An argon ion laser (0.64 μm wavelength) with a beam focussed to a 50 μm diameter spot and a power of 7 W was used to treat the sample. The beam was scanned along a line of via holes at a rate of approximately 5 cm per second. The resulting structure contained single crystals of approximately 10 μm size over each via hole. Each of these crystals possessed the orientation of the substrate crystal. The size of the crystal was limited by the relatively low power of the laser utilized.

What is claimed is:

1. A process for forming a single crystal region of a semiconductor material on a region of insulating material of a composite structure, said structure having a surface including a section of said insulating material and a section of single crystal material comprising the steps of forming said single crystal region of a semiconductor material so that it contacts said section of single crystal material of said composite structure wherein said semiconductor material comprises a Group IV element and said single crystal region of semiconductor material is produced by the procedure comprising the steps of forming a precursor region that interfaces with said single crystal material of said composite structure, initiating growth of said single crystal region of semiconductor material at the interface of said precursor region with said single crystal material of said composite structure, and propagating said growth into said precursor region continuously from said interface by producing a chemical potential gradient in said precursor region to complete said single crystal region in the absence of polycrystalline propagation initiated from a polycrystalline region wherein said polycrystalline propagation under the conditions of said chemical potential gradient limits said propagation from said interface, whereby said single crystal region overlies at least a portion of said insulating material and whereby said single crystal region is suitable for use in producing electronic devices.

2. The process of claim 1 wherein said surface of said composite structure is planar.

3. The process of claim 1 wherein said surface of said composite structure includes said section of single crystal material in a distinct plane from said insulating region.

4. The process of claim 1 wherein said single crystal material of said composite structure comprises a member of the group consisting of silicon and germanium.

5. The process of either claim 1 or 4 wherein said insulating material comprises a member chosen from the group consisting of a silicon oxide or a silicon nitride.

6. The process of either claim 1 or 4 wherein said precursor region comprises silicon.

7. The process of claim 6 wherein said precursor region comprises an alloy of silicon.

8. The process of claim 6 wherein said composite structure is formed by oxidizing a portion of said composite structure which comprises silicon.

9. The process of claim 1 wherein said composite structure comprises a supporting substrate.

10. The process of claim 1 wherein said precursor region comprises germanium.

11. The process of claim 1 wherein a plurality of said sections of single crystal material of said composite structure is employed.

12. The process of claim 1 including the step of electrically isolating said essential single crystal region of said semiconductor material.

13. The process of claim 1 wherein said composite structure is formed by etching a hole in an insulating layer to uncover portions of an underlying section of single crystal material to provide said insulating material and said crystal material.

* * * * *